US006396116B1

United States Patent
Kelly et al.

(10) Patent No.: US 6,396,116 B1
(45) Date of Patent: May 28, 2002

(54) INTEGRATED CIRCUIT PACKAGING FOR OPTICAL SENSOR DEVICES

(75) Inventors: Michael G. Kelly, Corvallis, OR (US); James-Yu Chang, Cupertino; Gary Dean Sasser, San Jose, both of CA (US); Andrew Arthur Hunter, Bristol (GB); Cheng-Cheng Chang, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/513,797

(22) Filed: Feb. 25, 2000

(51) Int. Cl.[7] .................. H01L 27/148; H01L 23/48; H01L 23/56
(52) U.S. Cl. .................. 257/432; 257/433; 257/434; 257/435; 257/680; 257/737; 257/738; 257/777; 257/668; 257/222; 257/291; 257/774; 257/724; 257/728; 257/693; 257/215; 257/704; 257/778; 257/786
(58) Field of Search .................. 257/680, 734, 257/737, 738, 777, 222, 215, 291, 434, 692, 693, 686, 685, 778–780, 784, 786, 724, 728, 668, 774, 432, 435, 433, 704

(56) References Cited

U.S. PATENT DOCUMENTS

| 5,394,490 A | | 2/1995 | Kato et al. .................. 385/14 |
|---|---|---|---|
| 5,811,799 A | | 9/1998 | Wu .................. 250/239 |
| 5,821,532 A | | 10/1998 | Beaman et al. .................. 250/239 |
| 5,861,654 A | | 1/1999 | Johnson .................. 257/433 |
| 6,011,294 A | * | 1/2000 | Wetzel .................. 257/434 |
| 6,059,188 A | * | 5/2000 | diFazio et al. .................. 235/462.36 |
| 6,130,448 A | * | 10/2000 | Bauer et al. .................. 257/222 |
| 6,147,389 A | * | 11/2000 | Stern et al. .................. 257/434 |
| 6,150,724 A | * | 11/2000 | Wenzelet et al. .................. 257/778 |
| 6,303,387 B1 | * | 10/2001 | Muramatsu .................. 174/260 |

* cited by examiner

Primary Examiner—Alexander O. Williams

(57) ABSTRACT

An optical device packaging technique involves an optical sensor that is formed on a first substrate and flip chip bonded to a second substrate. The second substrate includes a through hole or a transparent section that is aligned with the optical sensor in order to allow light to contact the optical sensor. An embodiment of an optical device structure includes an optical sensor, a first substrate, a second substrate, and a circuit board. The optical sensor is formed on or within the first substrate and the individual sensors or pixels of the optical sensor are electrically connected to contact pads that are exposed on the first substrate. The first substrate is flip chip bonded to the second substrate. The second substrate is flip chip bonded to a circuit board. Another embodiment of an optical device structure includes an optical sensor, a first substrate, and a circuit board as the second substrate. In the embodiment, contact pads of the first substrate are flip chip bonded to contact pads of the circuit board with conductive balls. The connection between the first substrate and the circuit board provides the electrical connection between the optical sensor and the circuit board.

21 Claims, 6 Drawing Sheets

INTEGRATED CIRCUIT PACKAGING FOR OPTICAL SENSOR DEVICES

FIELD OF THE INVENTION

The invention relates generally to the packaging of optical sensors, and more particularly to packaging optical sensors utilizing flip chip packaging techniques.

BACKGROUND OF THE INVENTION

Devices such as digital cameras, displays, and scanners typically utilize an integrated circuit that generates electrical signals in response to incident light. The integrated circuit may include optical sensors, such as CCDs or active pixel sensors. In order for the integrated circuit to transport the generated electrical signals to supporting systems, the light sensitive integrated circuit is packaged and interconnected to a circuit board.

FIG. 1 is a depiction of a known optical sensor package arrangement. The optical sensor 104 is formed on a first substrate 106. The optical sensor receives light 108 and generates electrical signals in proportion to the intensity of the received light and then transmits the electrical signals to conductors within the first substrate. The first substrate is typically an integrated circuit that has electrical interconnections between each pixel in the optical sensor and contact pads 110 that are formed on the surface of the first substrate. The contact pads on the surface of the first substrate allow electrical connections to be made to a larger scale package.

The first substrate 106 is physically attached to a second substrate 112 such as an injection molded plastic, a glass reinforced laminate, or a ceramic package. The contact pads on the first substrate are electrically connected to bonding pads on the second substrate by very fine bonding wires 114. The optical sensor 104 and the first substrate 106 are typically covered with an optical glass cover 116 in order to seal the optical sensor within a package and protect the optical sensor from the outside environment.

The sealed package is then electrically connected to contact pads of a circuit board 118 by package leads 120 and solder bonds 122. The circuit board connects the optical sensor to other systems, such as memory and processors that are needed to support the desired functionality. In applications such as hand held digital cameras or scanners, a lens 130 may also be located above the glass cover and the optical sensor in order to focus incoming light 108 onto the optical sensor.

Although prior art optical sensor packaging techniques work well, as the size of electronic devices, especially hand held devices, shrinks, there is a need to package the optical sensors in smaller packages. The need for smaller packaging is especially important in the height dimension of the package, as measured from the lens to the circuit board. That is, it is desirable to provide optical sensors in"thinner" packages.

One technique that has been utilized to package non-light sensitive integrated circuits with a large number of electrical connections is a ball grid array (BGA) mounting technique. Utilizing the BGA mounting technique, an integrated circuit is connected to a BGA package and the BGA package is physically and electrically connected to a circuit board with solder balls. The solder balls are soldered to contact pads on the BGA package and to corresponding contact pads on the circuit board. When a large number of electrical contacts is required between the BGA package and the circuit board, the solder balls are placed in a closely spaced array. As is known in the prior art, a solder reflow process is typically utilized to connect the solder balls to the conductive contact pads of the BGA package and to the conductive contact pads of the circuit board. Although the BGA mounting technique works well, the BGA mounting technique is generally utilized for packaging and mounting non-light sensitive integrated circuits, such as microprocessors and application specific integrated circuits.

In view of the desire for smaller electronic devices, such as cameras, displays, and scanners, what is needed is a packaging technique that allows optical sensors to be packaged in thinner packages.

SUMMARY OF THE INVENTION

An optical device packaging technique involves an optical sensor that is formed on a first substrate and flip chip bonded to a second substrate. The second substrate includes a through hole or a transparent material that is aligned with the optical sensor in order to allow light to contact the optical sensor. By flip chip bonding the first substrate to the second substrate, the optical sensor is provided in a thin package that is useful in many applications, such as hand held cameras.

A first embodiment of an optical device structure includes an optical sensor, a first substrate, a second substrate, and a circuit board. The optical sensor is formed on or within the first substrate and the individual sensors or pixels of the optical sensor are electrically connected to contact pads that are exposed on the top surface of the first substrate. The first substrate is connected to the second substrate by solder balls that connect contact pads on the bottom surface of the second substrate to corresponding contact pads on the first substrate. The second substrate is a package substrate, such as an injection molded plastic substrate, a ceramic substrate, or a glass reinforced laminate. The second substrate includes electrical conductors that electrically connect the first set of contact pads to a second set of contact pads on the periphery of the second substrate. In an embodiment, the second substrate includes a through hole that allows light to contact the optical sensor.

The second substrate is connected to the circuit board with interconnects, such as solder balls, as is known in the art of ball grid array mounting. The interconnects provide an electrical connection between a second set of contact pads on the second substrate and corresponding contact pads on the circuit board. As a result of the various levels of electrical interconnections, the individual light sensitive devices of the optical sensor are electrically connected to the conductive contact pads of the circuit board in a thin package.

The first embodiment may include an optical glass cover that is placed over the opening in the second substrate in order to protect the optical sensor from damage while allowing light to contact the optical sensor.

The first embodiment may include an optical grade structural adhesive that is applied directly over the optical sensor instead of an optical glass cover that is attached to the second substrate.

The first embodiment may include an optical lens system that is placed over the opening in the second substrate in order to enable focusing of light onto the optical sensor.

The first embodiment may include an optical glass substrate as the second substrate. The optical glass substrate may include metal patterning on the bottom surface that provides a portion of the electrical connection between the optical sensor and the circuit board. The first embodiment may include an optically transparent glass structure that includes an integrated lens element, or multiple elements, as the second substrate.

The first embodiment may be incorporated into a camera housing that includes an opening for allowing light to contact the optical sensor.

A second embodiment of an optical device structure includes an optical sensor, a first substrate, and a circuit board as the second substrate. In the embodiment, contact pads of the first substrate are connected to contact pads of the circuit board with conductive balls. The connection between the first substrate and the circuit board provides the electrical connection between the optical sensor and the circuit board. In an embodiment, the circuit board includes a through hole that allows light to contact the optical sensor. A transparent circuit board may alternatively allow light to contact the optical sensor.

The second embodiment may include an optical glass cover that is placed over the opening in the circuit board in order to protect the optical sensor from damage while allowing light to contact the optical sensor.

The second embodiment may include an optical grade structural adhesive that is applied directly over the optical sensor instead of an optical glass cover that is attached to the circuit board.

The second embodiment may include an optical lens system that is placed over the opening in the circuit board in order to enable focusing of light onto the optical sensor.

The second embodiment may include a monolithic glass structure that includes a lens element or multiple lens elements as the circuit board. In an embodiment, the monolithic glass structure forms part of a camera housing.

Other aspects and advantages of the present invention will become apparent from the following detailed description, taken in conjunction with the accompanying drawings, illustrating by way of example the principals of the invention.

DETAILED DESCRIPTION OF THE INVENTION

Figure 1:
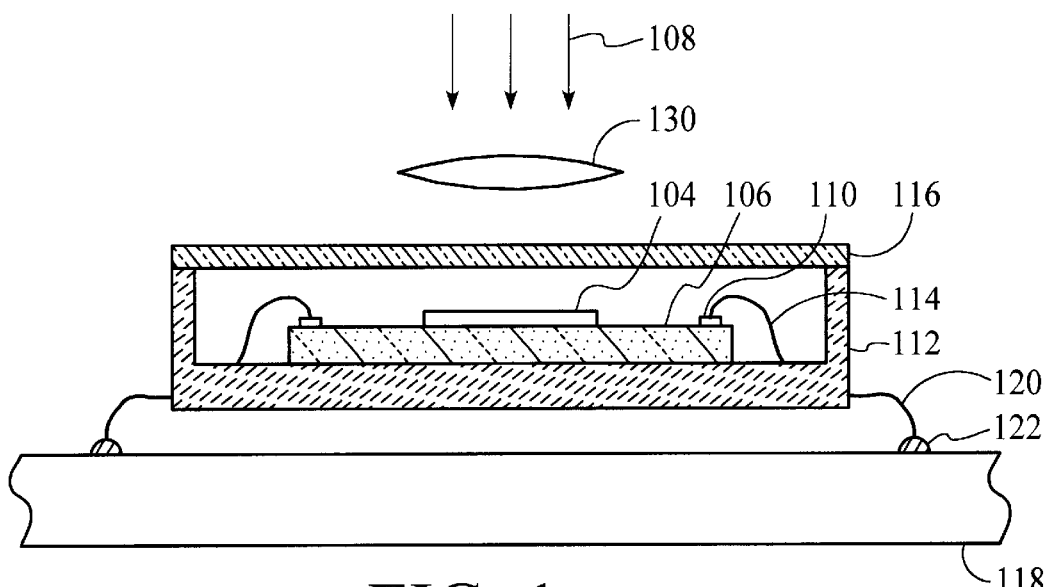
FIG. 1 is a depiction of a known optical sensor package arrangement in which an optical sensor package is wire bonded to a circuit board.
Figure 2:
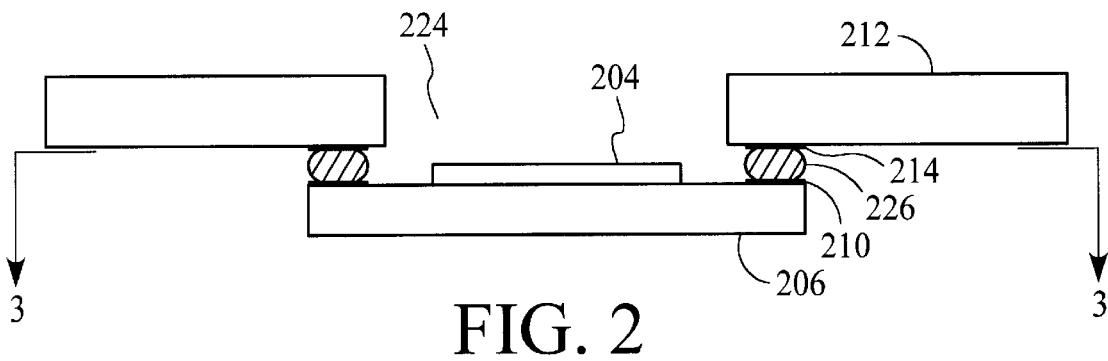
FIG. 2 is a cross sectional view of an optical device structure including an optical sensor that is formed on a first substrate and flip chip bonded to a second substrate, in accordance with an embodiment of the invention.

FIG. 2 is a cross sectional view of an optical device structure including an optical sensor that is flip chip bonded to a substrate. The cross sectional view includes an optical sensor 204, a first substrate 206, and a second substrate 212. The optical sensor is formed on or within the first substrate and the individual sensors or pixels of the optical sensor are electrically connected to contact pads 210 that are exposed on the top surface of the first substrate. In an embodiment, the optical sensor is a CCD array or an active pixel sensor array and the first substrate is an integrated circuit formed in a bulk silicon substrate. The first substrate includes circuitry that is connected to each element of the optical sensor and to the contact pads that are exposed around the outer edge of the top surface of the first substrate.

The first substrate 206 is connected to the second substrate 212 at contact pads 214 that are exposed on the bottom surface of the second substrate. As is described in more detail below, the second substrate may be a package substrate, such as ceramic or molded plastic or the second substrate may be a circuit board. In an embodiment, the second substrate includes a through hole 224 that allows light to contact the optical sensor. Although FIG. 2 and subsequent figures depict a through hole for allowing light to contact the optical sensor, in other configurations, the second substrate may include a transparent material that allows light to contact the optical sensor or the second substrate may be a transparent material that allows light to contact the optical sensor.

Regardless of whether the second substrate 212 is a ceramic package, a molded plastic package, or a circuit board, the contact pads 214 of the second substrate are electrically connected to the contact pads 210 of the first substrate 206. In an embodiment, the first substrate and second substrate are electrically connected with solder balls 226, although the two substrates may be electrically connected utilizing other conductive members or materials, such as a conductive adhesive that electrically connects the contact pads of the two substrates. Although not shown in FIG. 2, the contact pads of the two substrates may be connected by a combination of conductive balls and an adhesive. In addition to electrically connecting the first substrate and the second substrate, the location of the contact pads on the first substrate and the second substrate determines the alignment of the first substrate, and ultimately the optical sensor 204, in relation to the second substrate and the opening 224 in the second substrate, as shown in FIG. 2.

Figure 3:
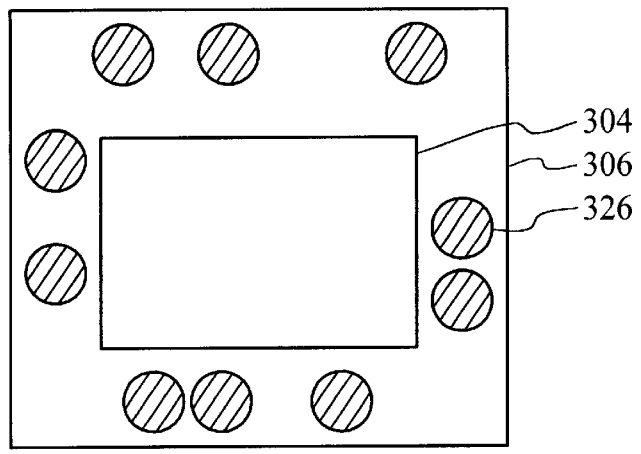
FIG. 3 is a top view of the first substrate shown in FIG. 2 taken at section 3—3.

FIG. 3 is a top view of the first substrate 306 taken at section 3—3. The top view of FIG. 3 shows the first substrate in relation to the optical sensor 304 and in relation to the connection points 326 that electrically connect the first substrate to the second substrate. Although only ten connection points are shown for description purposes, an optical sensor typically has multiple connection points.

Figure 4A:
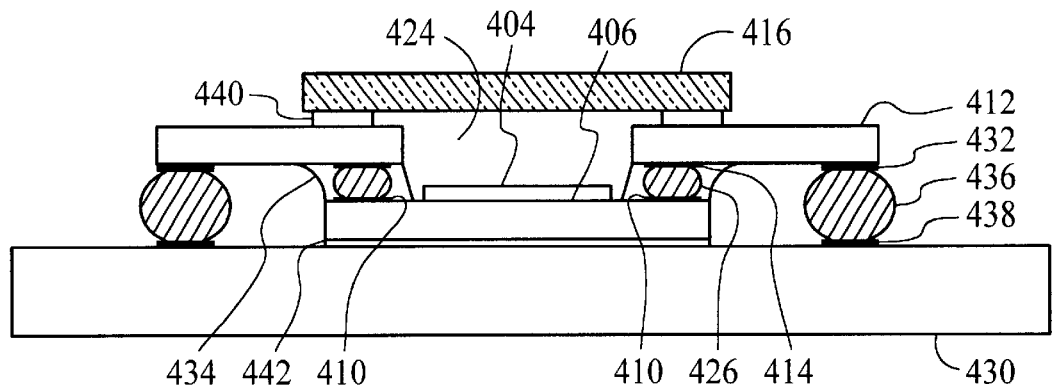
FIG. 4A is a cross sectional view of an optical device structure that includes an optical sensor, a first substrate, a second substrate, a circuit board, and an optical glass cover, in accordance with an embodiment of the invention.

FIG. 4A is a cross sectional view of an optical device structure that incorporates the elements of FIG. 2 and 3. The optical device structure shown in FIG. 4A includes an optical sensor 404, a first substrate 406, a second substrate 412, a circuit board 430, and an optical glass cover 416. Throughout the specification, similar elements are numbered similarly from figure to figure in order to provide for consistent reference. In the embodiment of FIG. 4A, the second substrate is a package substrate, such as an injection molded plastic substrate, a ceramic substrate, or a glass reinforced laminate. The second substrate includes electrical conductors (not shown) that electrically connect the inner contact pads 414 to contact pads 432 on the periphery of the second substrate.

The optical sensor 404, the first substrate 406 and the connection between the first substrate and the second substrate 412 are similar to those described with reference to FIGS. 2 and 3. As shown in FIG. 4A, the connection between the first substrate and the second substrate may include a structural adhesive 434 around the solder balls 426 and contact pads 410 and 414, however this may not be required.

In the embodiment of FIG. 4A, the second substrate 412 is connected to the circuit board 430 with interconnects 436, such as solder balls, as is known in the art of ball grid array mounting. The interconnects provide an electrical connection between contact pads 432 on the second substrate and contact pads 438 on the circuit board. The contact pads 432 could be located on either side of the second substrate.

As is known in the art of integrated circuit packaging and surface mounting to circuit boards, contact pads on the second substrate 412 and on the circuit board 430 are connected to conductive leads (not shown) that enable electrical signals to travel through the second substrate and the circuit board, respectively. As a result of the various levels of electrical interconnections, the individual light sensitive devices of the optical sensor 404 are electrically connected to the conductive contact pads of the circuit board. Electrical signals generated by the optical sensor can be transmitted from the optical sensor and through the circuit board to other devices on the circuit board, such as memory and processors.

The optical glass cover 416 is placed over the through hole 424 in the second substrate 412 in order to protect the optical sensor 404 from damage while allowing light to contact the optical sensor. The optical glass cover is preferably attached to the top surface of the second substrate with an adhesive 440 in order to completely cover the through hose and to create a sealed environment for the optical sensor. In another embodiment, the optical glass cover may not completely cover the through hole but covers substantially all of the through hole.

The first substrate 406 may also be attached to the circuit board 430 with an adhesive 442, as shown in FIG. 4A. The adhesive may be thermally conductive in order to dissipate heat from the optical sensor 404 and the adhesive may provide a structurally secure connection between the optical sensor and the circuit board. In addition, a lens (not shown) may be located above the optical glass in order to focus light onto the optical sensor.

Figure 4B:
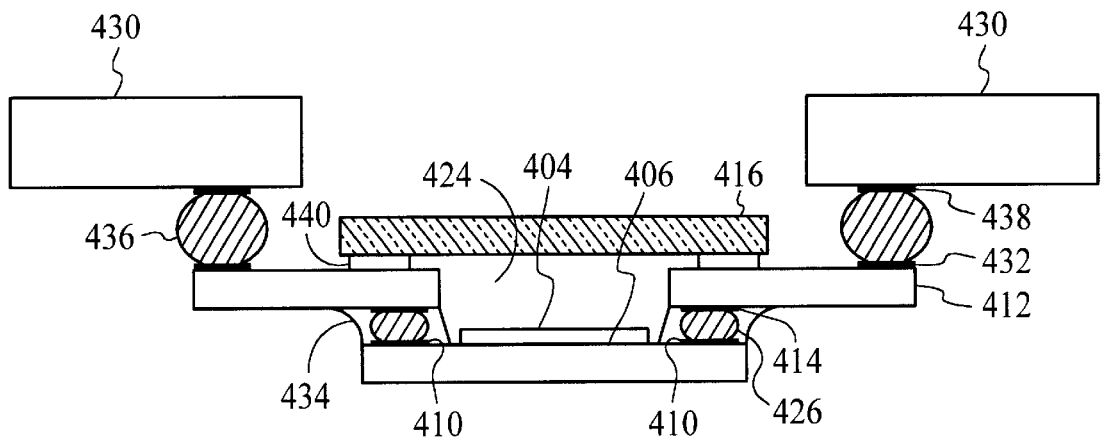
FIG. 4B is a cross sectional view of an optical device structure that includes an optical sensor, a first substrate, a second substrate, a circuit board above the second substrate, and an optical glass cover, in accordance with an embodiment of the invention.

An embodiment of an optical device structure having the circuit board on the opposite side of the second substrate is shown in FIG. 4B. As shown in FIG. 4B, the circuit board has an opening or a transparent section that allows light to contact the optical sensor 404. In the embodiment of FIG. 4B, it is preferable that the opening is large enough to allow the optical glass cover to pass through the opening. Although not depicted in the figures, the circuit board location in FIG. 4B can be utilized in the embodiments of FIGS. 5, 6, 7, and 8.

Figure 5:
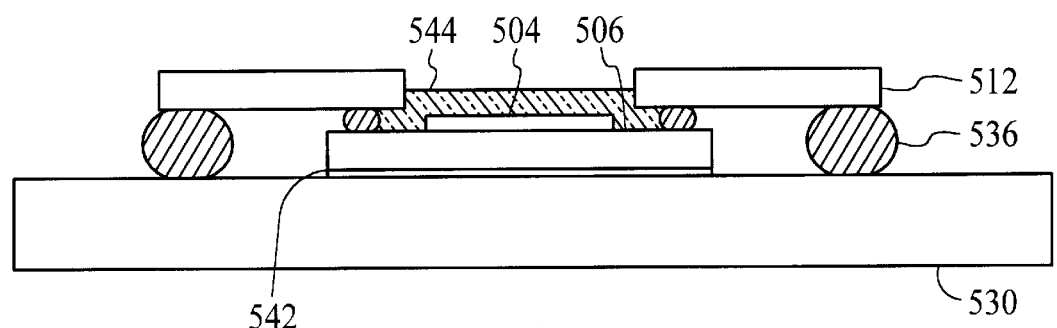
FIG. 5 is a cross sectional view of an optical device structure that is similar to FIG. 4A except that the optical glass cover is replaced with an optical grade structural adhesive, in accordance with an embodiment of the invention.

FIG. 5 is a cross sectional view of an optical device structure that is similar to FIG. 4A. The main difference between the optical device structure of FIG. 4A and the optical device structure of FIG. 5 is that the optical device structure of FIG. 5 includes an optical grade structural adhesive 544 that is applied directly over the optical sensor 504 instead of an optical glass cover that is attached to the second substrate 512. In an embodiment, the optical grade structural adhesive is in direct contact with the optical sensor and the first and second substrates 506 and 512. The optical grade structural adhesive protects the optical sensor from damage and may provide structural integrity to the connection between the first and second substrates. The first substrate is attached to the circuit board 530 with an adhesive 542, although this is not critical to the invention.

Figure 6:
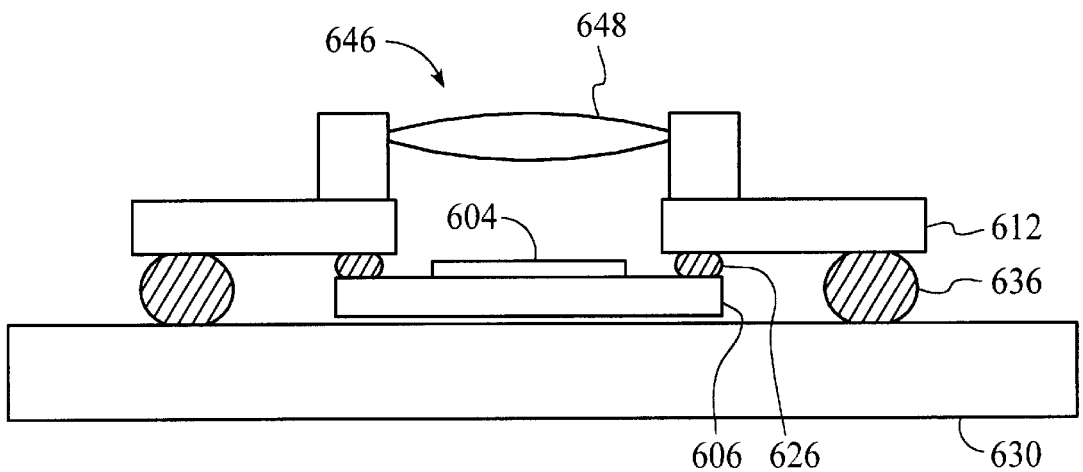
FIG. 6 is a cross sectional view of an optical device structure that is similar to FIG. 4A except that the optical glass cover is replaced with a lens system, in accordance with an embodiment of the invention.

FIG. 6 is a cross sectional view of an optical device structure that is similar to FIG. 4A. The main difference between the optical device structure of FIG. 4A and the optical device structure of FIG. 6 is that the optical glass cover is replaced with an optical lens system 646. The optical lens system allows light to be focused onto the optical sensor 604 for applications such as hand held digital cameras. In an embodiment, the lens 648 of the optical lens system is adjustable to provide focusing at various distances and in other embodiments the lens may be fixed. The optical lens system is attached to the top surface of the second substrate 612 in a manner that creates a clean environment for the optical sensor. In an embodiment, the bottom surface of the first substrate 606 is not attached to the circuit board 630, although this is not critical.

Figure 7:
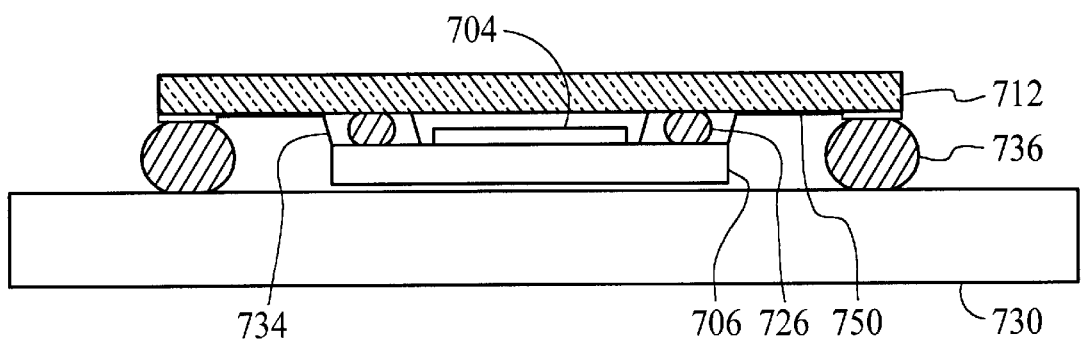
FIG. 7 is a cross sectional view of an optical device structure that is similar to FIG. 4A except that the second substrate is a metal patterned glass, in accordance with an embodiment of the invention.

FIG. 7 is a cross sectional view of an optical device structure that is similar to FIG. 4A. The main difference between the optical device structure of FIG. 4A and the optical device structure of FIG. 7 is that the second substrate 712 in the optical device structure of FIG. 7 is an optical glass substrate. The optical glass substrate includes metal patterning 750 on the bottom surface that provides a portion of the electrical connection between the optical sensor 704 and the circuit board 730. The metal patterning carries electrical signals from the first substrate 706 to the circuit board. In an embodiment, the first substrate and the optical glass substrate are electrically connected by conductive balls 726 and physically connected by an adhesive 734. In addition, the bottom surface of the optical glass substrate and the circuit board are electrically connected by conductive balls 736. In an embodiment, the bottom surface of the first substrate is not attached to the circuit board, although this is desirable if better heat dissipation is required. Although optical glass is described, other transparent materials may be utilized for any of the described embodiments.

Figure 8:
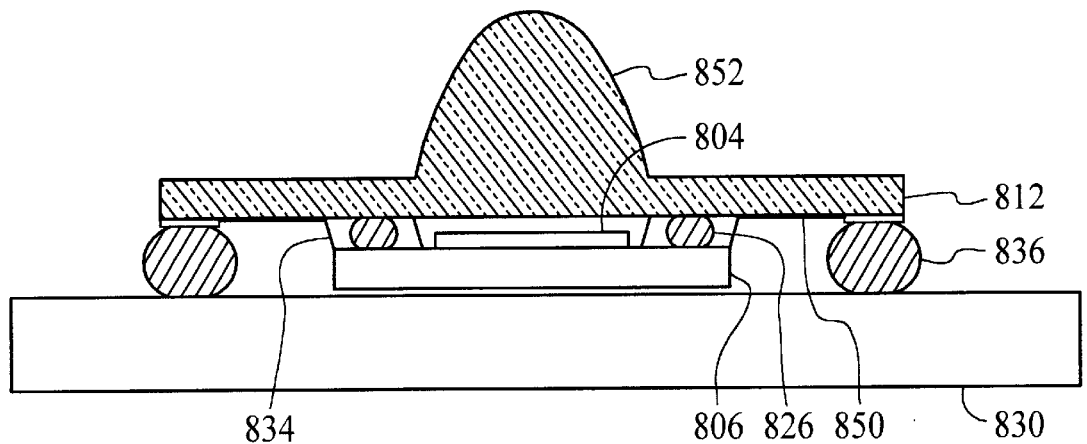
FIG. 8 is a cross sectional view of an optical device structure that is similar to FIG. 7 except that the metal patterned glass includes an integrated front lens element, in accordance with an embodiment of the invention.

FIG. 8 is a cross sectional view of an optical device structure that is similar to FIG. 7 except that the second substrate 812 includes a front lens element 852 that is incorporated into the optical glass. In an embodiment, the second substrate is an optically transparent monolithic glass structure that includes an integrated lens element that focuses light onto the optical sensor 804. Other embodiments may include several lens elements. Similar to FIG. 7, the optical glass includes metal patterning 850 that conducts electrical signals from the first substrate to the circuit board.

Figure 9:
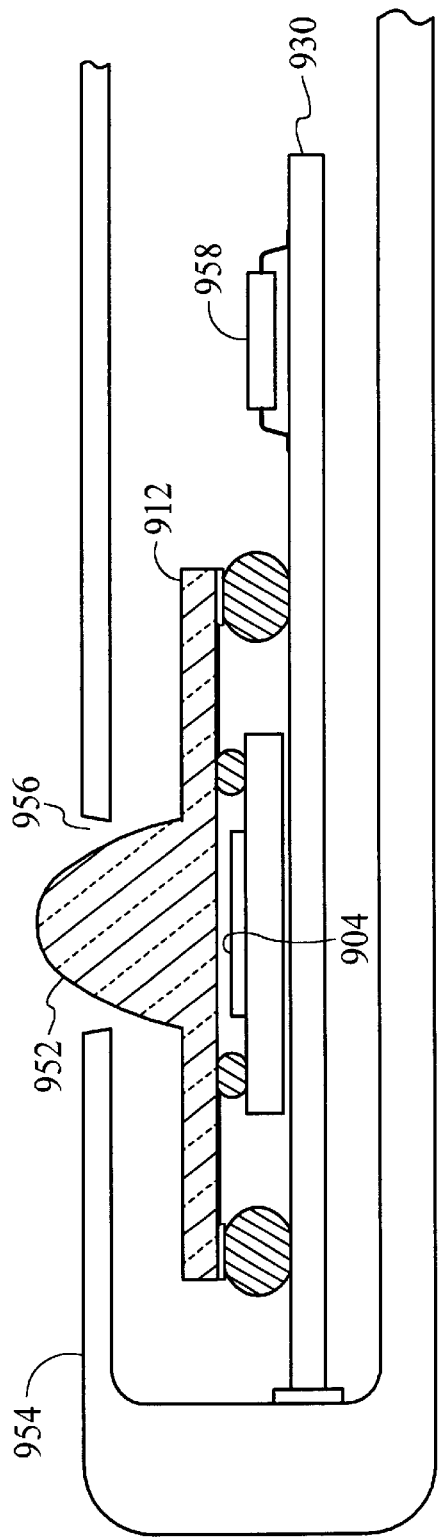
FIG. 9 is a cross sectional view of a hand held camera that incorporates the optical device structure of FIG. 8, in accordance with an embodiment of the invention.

FIG. 9 is a cross sectional view of a hand held camera that incorporates the optical device structure of FIG. 8. As shown in FIG. 9, the optical device structure is incorporated into a camera housing 954 that includes an opening 956 for allowing light to contact the optical sensor 904. In an embodiment, the circuit board 930 may include at least one other component 958, such as memory or a processor. Although FIG. 9 represents one configuration for incorporating the optical device structure of FIG. 8 into a camera housing, it should be appreciated that other configurations are possible.

Figure 10A:
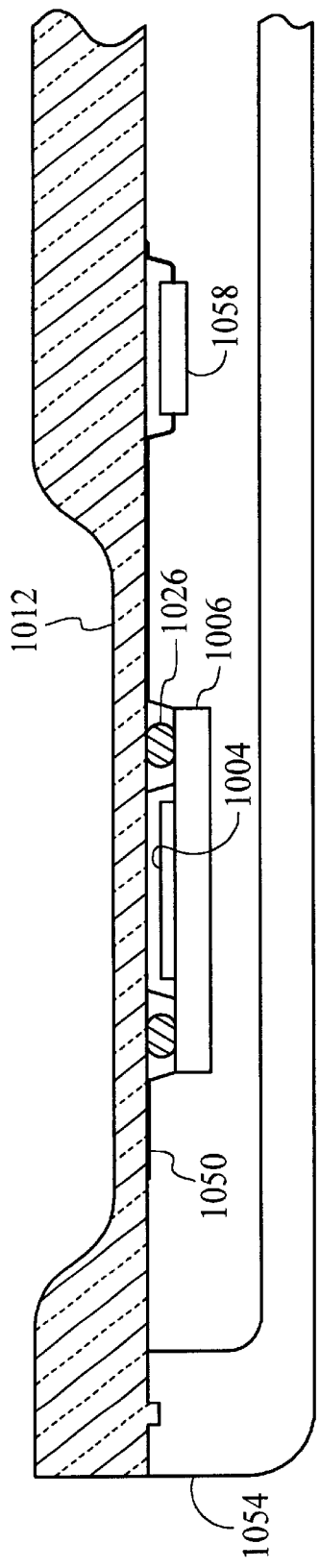
FIG. 10A is a cross sectional view of a hand held camera in which metal patterned glass serves as a circuit board, a package substrate, and a portion of the housing of a hand held camera, in accordance with an embodiment of the invention.

FIG. 10A is a cross sectional view of a hand held camera in which metal patterned glass 1012 serves as a circuit board and a package substrate. The metal patterned glass includes conductive patterns 1050 that enable electrical signals to be transmitted from the optical sensor 1004 to other electronic components 1058 within the camera such as memory and/or a processor. The metal patterned glass also forms a portion of the camera housing. In order to form a complete camera housing, the metal patterned glass is connected to a back camera housing 1054 that may be made of, for example, molded plastic or lightweight metal.

Figure 10B:
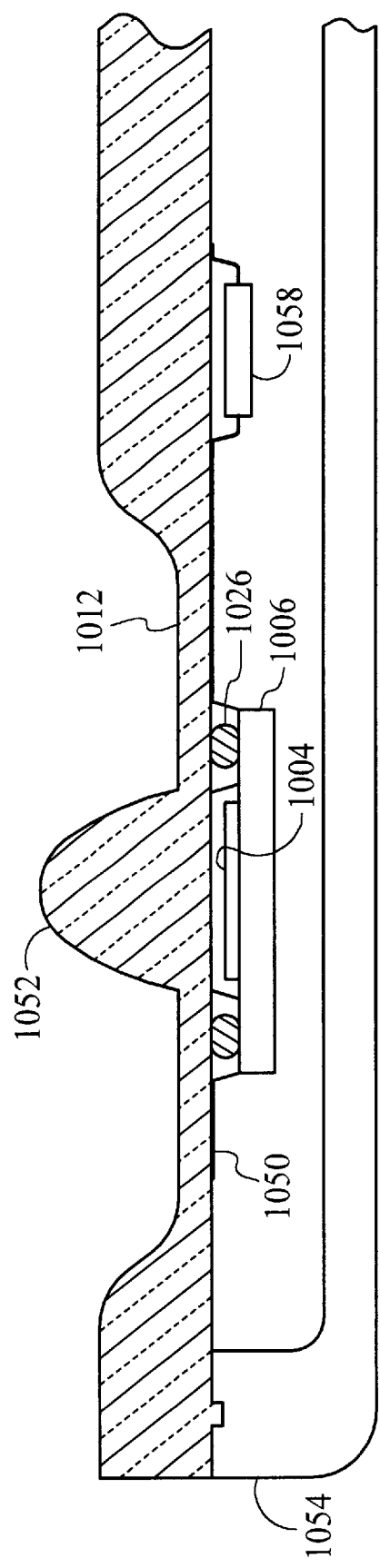
FIG. 10B is a cross sectional view of a hand held camera in which metal patterned glass with an integrated lens element serves as a circuit board, a package substrate, and a portion of the housing of a hand held camera, in accordance with an embodiment of the invention.

FIG. 10B shows that the metal patterned glass also includes an integrated lens 1052 that is incorporated into the optically transparent and monolithic element. Other embodiments may include several lens elements.

Figure 11:
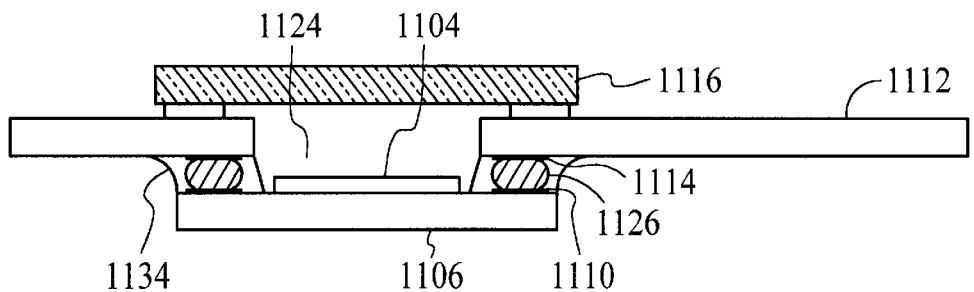
FIG. 11 is a cross sectional view of an optical device structure that includes an optical sensor, a first substrate, a circuit board, and an optical glass cover, in accordance with an embodiment of the invention.

FIG. 11 is a cross sectional view of an optical device structure that incorporates the elements of FIGS. 2 and 3. The optical device structure shown in FIG. 11 includes an optical sensor 1104, a first substrate 1106, a circuit board 1112 as the second substrate, and an optical glass cover 1116. In the embodiment of FIG. 11, contact pads 1110 of the first substrate are connected to contact pads 1114 of the circuit board with conductive balls 1126 and an adhesive 1134. Although a conductive adhesive is utilized to connect the first substrate to the circuit board, it may not be required. Other techniques, such as soldering, may be utilized to connect the contact pads of the first substrate to the contact pads of the circuit board. The connection between the first substrate and the circuit board provides the electrical connection between the optical sensor and the circuit board. In an embodiment, the circuit board includes a through hole 1124 that allows light to contact the optical sensor. A transparent circuit board may alternatively allow light to contact the optical sensor. Although conductive balls are described, other conductive members may be utilized to form the electrical connection between the first substrate and the circuit board.

The optical glass cover 1116 is placed over the through hole 1124 in the circuit board in order to protect the optical sensor 1104 from damage while allowing light to contact the optical sensor. The optical glass cover is preferably attached to the top surface of the circuit board 1112 in a manner that creates a sealed environment for the optical sensor.

Figure 12:
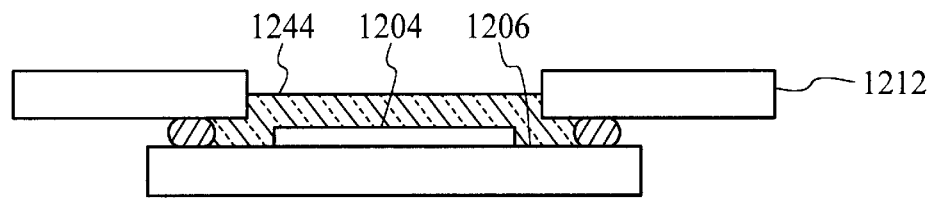
FIG. 12 is a cross sectional view of an optical device structure that is similar to FIG. 11 except that the optical glass cover is replaced with an optical grade structural adhesive, in accordance with an embodiment of the invention.

FIG. 12 is a cross sectional view of an optical device structure that is similar to FIG. 11. The main difference between the optical device structure of FIG. 11 and the optical device structure of FIG. 12 is that the optical device structure of FIG. 12 includes an optical grade structural adhesive 1244 that is applied directly over the optical sensor 1204 instead of an optical glass cover that is attached to the circuit board 1212. In an embodiment, the optical grade structural adhesive is in direct contact with the optical sensor and the first substrate 1206, and the circuit board. The optical grade structural adhesive protects the optical sensor from damage and may provide structural integrity to the connection between the first substrate and the circuit board.

Figure 13A:
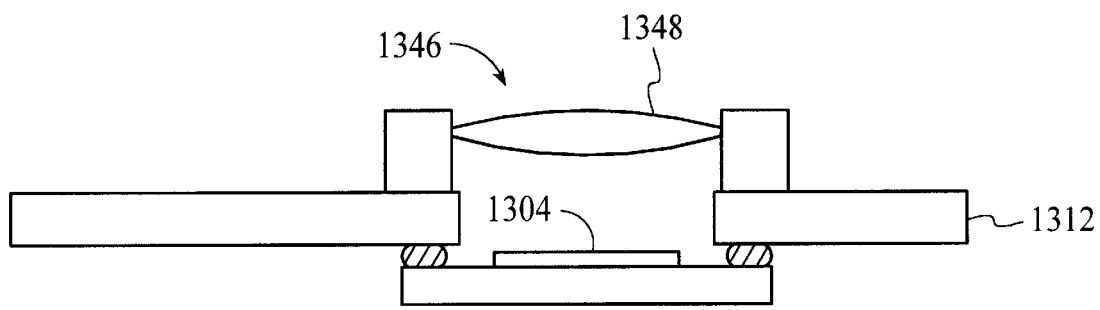
FIG. 13A is a cross sectional view of an optical device structure that is similar to FIG. 11 except that the optical glass cover is replaced with a lens system, in accordance with an embodiment of the invention.
Figure 13B:
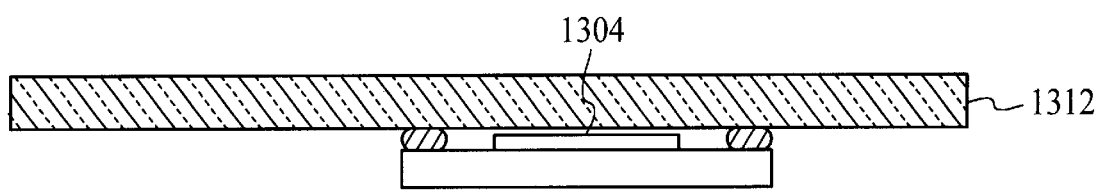
FIG. 13B is a cross sectional view of an optical device structure that is similar to FIG. 11 except that the circuit board is a transparent material, in accordance with an embodiment of the invention.

FIG. 13A is a cross sectional view of an optical device structure that is similar to FIG. 11. The main difference between the optical device structure of FIG. 11 and the optical device structure of FIG. 13A is that the optical glass cover connected to the circuit board is replaced with an optical lens system 1346 that is connected to the circuit board 1312. The optical lens system allows light to be focused onto the optical sensor 1304 for applications such as hand held digital cameras. In an embodiment, the lens 1348 is adjustable to provide focusing at various distances and in other embodiments the lens may be fixed. The optical lens system is attached to the top surface of the circuit board with an adhesive in order to create a sealed environment for the optical sensor. FIG. 13B is cross sectional view of an optical device structure that is similar to FIG. 11. The main difference is that the circuit board itself is a transparent material, eliminating the need for an opening to pass light.

What is claimed is:

1. An optical device structure comprising:
   a first substrate comprising:
      a first major surface and a second major surface;
      an optical sensor located at said first major surface;
      a plurality of connection points formed at said first major surface, wherein said optical sensor is electrically connected to at least a portion of said plurality of connection points;
   a second substrate comprising;
      a first major surface and a second major surface;
      means, aligned with said optical sensor, for allowing light to be detected by said optical sensor;
      a first plurality of conductive pads located at said first major surface and aligned with said plurality of connection points of said first substrate, wherein said plurality of connection points of said first substrate are flip chip bonded to said first plurality of conductive pads of said second substrate;
      a second plurality of conductive pads physically connected to said second substrate and electrically connected to said first plurality of conductive pads; and
   a circuit board comprising;
      a first major surface and a second major surface;
      a third plurality of conductive pads formed on said first major surface of said circuit board and aligned with said second plurality of conductive pads of said second substrate;

a plurality of interconnects connected between said second plurality of conductive pads of said second substrate and said third plurality of conductive pads of said circuit board, wherein said second plurality of conductive pads of said second substrate are flip chip bonded to said third plurality of conductive pads of said circuit board; wherein said optical sensor is electrically connected to said third plurality of conductive pads of said circuit board.

2. The optical device structure of claim 1 wherein said means for allowing light to be detected by said optical sensor includes a through hole within said second substrate.

3. The optical device structure of claim 1 further including an optical glass cover connected to said second surface of said second substrate, wherein said optical glass cover completely covers or substantially covers said through hole within said second substrate.

4. The optical device structure of claim 1 further including an optical grade structural adhesive formed over said optical sensor.

5. The optical device structure of claim 1 wherein said second major surface of said first substrate is physically connected to said first major surface of said circuit board.

6. The optical device structure of claim 1 wherein said second substrate is optically transparent.

7. The optical device structure of claim 1 further including an optical lens system that is connected to said second major surface of said second substrate and aligned with said optical sensor such that light is focused onto said optical sensor.

8. The optical device structure of claim 1 wherein said second substrate includes an optically transparent and monolithic lens element or multiple lens elements.

9. The optical device structure of claim 8 wherein said first substrate, said second substrate, and said circuit board are integrated with a hand held camera housing.

10. The optical device structure of claim 1 wherein said plurality of interconnects includes solder balls that form electrical connections between said second plurality of conductive pads of said second substrate and said third plurality of conductive pads of said circuit board.

11. An optical device structure comprising:
   a first substrate comprising:
      a first major surface and a second major surface;
      an optical sensor located at said first major surface;
      a plurality of connection points formed at said first major surface, wherein said optical sensor is electrically connected to at least a portion of said plurality of connection points; and
   a circuit board comprising;
      a first major surface and a second major surface;
      means, aligned with said optical sensor, for allowing light to be detected by said optical sensor;
      a plurality of conductive pads located at said first major surface and aligned with said plurality of connection points of said first substrate;
      a plurality of interconnects flip chip bonded between said plurality of connection points of said first substrate and said plurality of conductive pads of said circuit board;
      a plurality of conductive leads physically connected to said circuit board and electrically connected to said plurality of conductive pads;
   wherein said optical sensor is electrically connected to said plurality of conductive leads of said circuit board.

12. The optical structure of claim 11 wherein said means for allowing light to be detected by said optical sensor includes a through hole within said circuit board.

13. The optical device structure of claim 11 further including an optical glass cover connected to said second surface of said circuit board, wherein said optical glass cover completely covers or substantially covers said through hole within said circuit board.

14. The optical device structure of claim 11 further including an optical grade structural adhesive formed over said optical sensor.

15. The optical device structure of claim 11 wherein said plurality of interconnects includes solder balls that form electrical connections between said plurality of connection points of said first substrate and said plurality of conductive pads of said circuit board.

16. The optical device structure of claim 11 further including an optical lens system that is connected to said second major surface of said circuit board and aligned with said optical sensor such that light is focused onto said optical sensor.

17. The optical device structure of claim 11 wherein said circuit board is optically transparent.

18. The optical device structure of claim 11 wherein said circuit board includes a monolithic lens element or multiple lens elements that includes conductive patterning on said first major surface.

19. The optical device structure of claim 18 wherein said optically transparent and monolithic lens element or multiple lens elements forms a portion of a hand held camera housing and wherein said first substrate is located within said hand held camera housing.

20. An optical device structure comprising:
   a first substrate comprising:
      a first major surface and a second major surface;
      an optical sensor located at said first major surface;
      a plurality of connection points formed at said first major surface, wherein said optical sensor is electrically connected to at least a portion of said plurality of connection points;
   a second substrate comprising;
      a first major surface and a second major surface;
      a through hole, aligned with said optical sensor, for allowing light to be detected by said optical sensor;
      a first plurality of conductive pads located at said first major surface and aligned with said plurality of connection points of said first substrate, wherein said plurality of connection points of said first substrate are flip chip bonded to said first plurality of conductive pads of said second substrate;
      a second plurality of conductive pads physically connected to said second substrate and electrically connected to said first plurality of conductive pads; and
   a circuit board comprising;
      a first major surface and a second major surface;
      a third plurality of conductive pads formed on said first major surface of said circuit board and aligned with said second plurality of conductive pads of said second substrate;
      a plurality of interconnects connected between said second plurality of conductive pads of said second substrate and said third plurality of conductive pads of said circuit board, wherein said second plurality of conductive pads of said second substrate are flip chip bonded to said third plurality of conductive pads;
   wherein said optical sensor is electrically connected to said third plurality of conductive pads on said circuit board.

21. The optical device structure of claim 20 wherein said second substrate is an optically transparent and monolithic lens element or multiple lens elements and wherein said first substrate, said optically transparent and monolithic lens element or multiple lens elements, and said circuit board are integrated with a hand held camera housing.

* * * * *